US010696565B2

(12) United States Patent
Janssen

(10) Patent No.: US 10,696,565 B2
(45) Date of Patent: Jun. 30, 2020

(54) METHOD AND DEVICE FOR TREATING A FLUID

(71) Applicant: DESOLENATOR B.V., Heerlen (NL)

(72) Inventor: Wilhelmus Franciscus Johannes Janssen, Abu Dhabi (AE)

(73) Assignee: DESOLENATOR B.V., Heerlen (NL)

( * ) Notice: Subject to any disclaimer, the term of this patent is extended or adjusted under 35 U.S.C. 154(b) by 486 days.

(21) Appl. No.: 14/433,141

(22) PCT Filed: Sep. 17, 2013

(86) PCT No.: PCT/EP2013/069222
§ 371 (c)(1),
(2) Date: Apr. 2, 2015

(87) PCT Pub. No.: WO2014/053308
PCT Pub. Date: Apr. 10, 2014

(65) Prior Publication Data
US 2015/0251923 A1    Sep. 10, 2015

(30) Foreign Application Priority Data

Oct. 2, 2012  (NL) ..................................... 2009557

(51) Int. Cl.
*C02F 1/14* (2006.01)
*C02F 1/04* (2006.01)
(Continued)

(52) U.S. Cl.
CPC ..................................... *C02F 1/14* (2013.01);
*B01L 3/00* (2013.01); *H01L 31/052* (2013.01);
(Continued)

(58) Field of Classification Search
None
See application file for complete search history.

(56) References Cited

U.S. PATENT DOCUMENTS

| 4,002,031 | A | 1/1977 | Bell |
| 4,312,709 | A | 1/1982 | Stark et al. |

(Continued)

FOREIGN PATENT DOCUMENTS

| CN | 201059804 | 5/2008 |
| WO | 8000077 | 1/1980 |

(Continued)

OTHER PUBLICATIONS

International Search Report and Written Opinion, Application No. PCT/EP2013/069222, dated Dec. 11, 2013.

*Primary Examiner* — Neil N Turk
(74) *Attorney, Agent, or Firm* — Barnes & Thornburg LLP

(57) ABSTRACT

A method comprising the steps of flowing a flow of relatively cold fluid along at least one photovoltaic solar panel being heated by solar energy towards and into a fluid treatment device, at least heating the flow of fluid in a fluid treatment device to divide the flow of fluid into a flow of a first fluid part and a flow of a second fluid part, flowing the flows of the first fluid part and the second fluid part from the fluid treatment device along the flow of relatively cold fluid. Before entering the fluid treatment device the flow of relatively cold fluid is preheated by the relatively warm photovoltaic solar panel and the relatively warm flow of the first fluid part and the relatively warm flow of the second fluid part.

8 Claims, 1 Drawing Sheet

(51) Int. Cl.
  *H01L 31/052* (2014.01)
  *B01L 3/00* (2006.01)
  *B01D 3/00* (2006.01)
  *C02F 103/08* (2006.01)
  *C02F 1/18* (2006.01)
  *C02F 101/10* (2006.01)

(52) U.S. Cl.
  CPC .......... *H01L 31/0521* (2013.01); *C02F 1/043* (2013.01); *C02F 1/18* (2013.01); *C02F 2101/10* (2013.01); *C02F 2103/08* (2013.01); *C02F 2201/009* (2013.01); *Y02A 20/128* (2018.01); *Y02A 20/129* (2018.01)

(56) References Cited

U.S. PATENT DOCUMENTS

| | | | |
|---|---|---|---|
| 4,323,052 A | | 4/1982 | Stark |
| 4,395,582 A | | 7/1983 | Damsker |
| 4,487,659 A | | 12/1984 | Stark |
| 4,749,447 A | | 6/1988 | Lew |
| 4,921,580 A | * | 5/1990 | Martes ............... B01D 3/10 |
| | | | 126/576 |
| 2010/0314238 A1 | | 12/2010 | Frolov et al. |
| 2011/0011802 A1 | | 1/2011 | Maydan |
| 2011/0120854 A1 | | 5/2011 | Lee |
| 2012/0234665 A1 | * | 9/2012 | Ba-abbad ............ B01D 1/0035 |
| | | | 203/10 |

FOREIGN PATENT DOCUMENTS

| | | |
|---|---|---|
| WO | 2009144700 | 12/2009 |
| WO | 2010104273 | 9/2010 |

\* cited by examiner

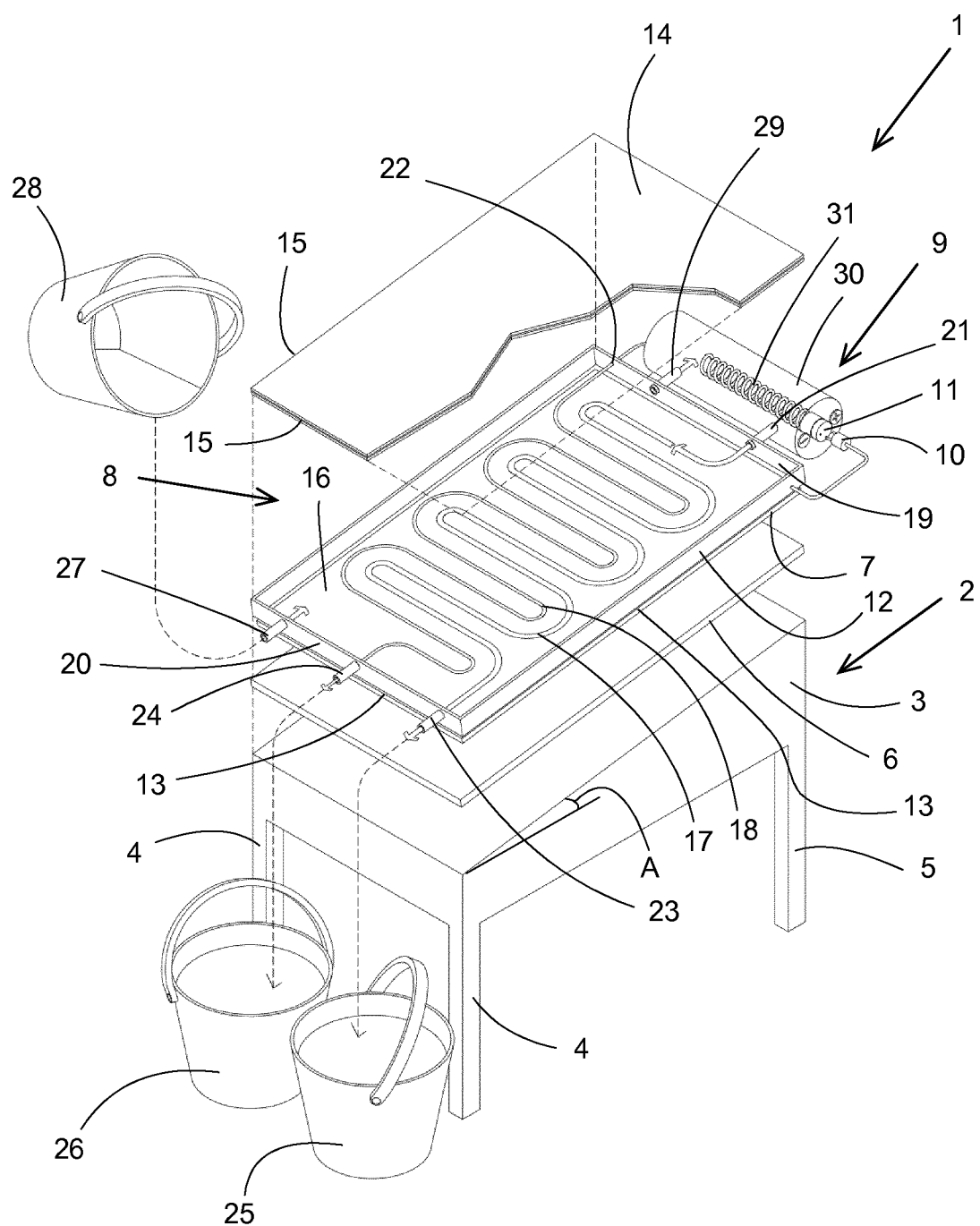

METHOD AND DEVICE FOR TREATING A FLUID

CROSS REFERENCE TO RELATED APPLICATIONS

This application is a U.S. nationalization under 35 U.S.C. § 371 of International Application No. PCT/EP2013/069222, filed Sep. 17, 2013, which claims priority to Netherlands Application No. 2009557, filed Oct. 2, 2012.

The invention relates to a method for treating a fluid, whereby the fluid is divided into at least a first and second fluid part.

The invention further relates to a device for treating a fluid, whereby the fluid is divided into at least a first and second fluid part, which device comprises at least a photovoltaic solar panel, a heat exchanger located against the photovoltaic solar panel and a fluid treatment device.

In such a method and device, which are known from US20110011802A1, a photovoltaic cell is cooled by a first flow of sea water flowing through a first heat exchanger due to which the sea water is heated. The heated first flow of sea water is directed into a water treatment unit, where the heat from the heated sea water is used to treat a second flow of salt water. The water treatment unit comprises a second heat exchanger and a desalinator unit to divide the second flow of sea water into a flow of desalinated water and concentrated salt water.

A disadvantage of the known method is that a relatively large amount of energy is lost in the two flows of sea water and a relatively large amount of additional energy is needed for the desalination process.

The object of the invention is to provide a method to divide a fluid into at least a first and second fluid part in an efficient and energy-saving manner.

This object is accomplished with the method according to the invention in that the method comprises the steps of:
- flowing a flow of relatively cold fluid along at least one photovoltaic solar panel being heated by solar energy towards and into a fluid treatment device;
- at least heating the flow of fluid in a fluid treatment device to divide the flow of fluid into a flow of a first fluid part and a flow of a second fluid part;
- flowing the flows of the first fluid part and the second fluid part from the fluid treatment device along the flow of relatively cold fluid;
- whereby before entering the fluid treatment device the flow of relatively cold fluid is being preheated by the relatively warm photovoltaic solar panel, the relatively warm flow of the first fluid part and the relatively warm flow of the second fluid part.

Since the relatively cold fluid is being preheated less energy is needed in the fluid treatment device to heat the fluid to a desired temperature which is needed for the process to divide the fluid into the two (or more) fluid parts.

Furthermore the photovoltaic solar panel will be cooled down by the heat transfer to the relatively cold fluid. It is known that photovoltaic solar panels work more efficiently if the temperature of the photovoltaic solar panel is not too high and being less than 75 degrees Celsius, for example.

By also transferring the heat both of the flows of the first and second fluid part leaving the fluid treatment device to the flow of fluid entering the fluid treatment device, the additional energy needed for raising the temperature of the fluid to be treated is relatively low and nearly no energy is lost.

The fluid and fluid parts may be a liquid or a gas. The fluid to be treated can be saline water, sea water, polluted water or other kinds of liquids or gasses which need to be divided into at least two fluid parts.

It has to be noted that U.S. Pat. No. 4,749,447 discloses a solar still wherein raw liquid becomes evaporated. The vapor is collected from evaporator conduits into vapor conduits and than guided into a condensor conduit. The flows in all conduits are all along a same continuous down slope.

The solar still of U.S. Pat. No. 4,749,447 does not comprise photovoltaic solar panels, does not comprise a fluid treatment device to divide the flow of fluid into a flow of a first fluid part and a flow of a second fluid part and the flow of relatively cold fluid is not being preheated by three different sources, being the relatively warm photovoltaic solar panel, the relatively warm flow of the first fluid part and the relatively warm flow of the second fluid part.

An embodiment of the method according to the invention is characterised in that by means of the photovoltaic solar panel solar energy is converted into electrical energy, which electrical energy is at least partly used to operate at least partly the fluid treatment device.

Preferably the amount of electrical energy generated by the photovoltaic solar panel is sufficient to operate the fluid treatment device. In this manner a self sustainable system is obtained whereby no external energy other than solar energy is needed. If more electrical energy is generated by the photovoltaic solar panel than needed, the surplus of electric energy can be stored in an accumulator, which energy can be used when there is not enough sun to generate the desired amount of electrical energy.

Another embodiment of the method according to the invention is characterised in that by heating the flow of fluid in the fluid treatment device, a part of the flow of fluid is evaporated into a vapor forming the first fluid part.

Such method of separating one fluid part of the other is relatively simple, especially if the boiling temperature of the two fluid parts differs. Also if the fluid comprises a solution of a solute and a solvent, the solvent can be partly evaporated as the first fluid part, while a remaining part of the solvent together with the solute will form the second fluid part. In the second part the concentration of the solute is much higher than in the original fluid.

Another embodiment of the method according to the invention is characterised in that the vapor is being flown along the flow of relatively cold fluid.

The vapor is relatively hot and a relatively large amount of energy can be recovered from the vapor and transferred to the flow of fluid. During the transfer of energy the vapor will condense.

Another embodiment of the method according to the invention is characterised in that the direction of the flows of the first and second fluid part is opposite to the direction of the flow of relatively cold fluid.

By flowing in opposite directions a good heat transfer is obtained.

Another embodiment of the method according to the invention is characterised in that the fluid is salt water, the first part is treated water and the second fluid part is brine.

Since the method according to the invention can be self sustainable or need only a small amount of external energy, the method is very suitable for desalination of water in areas with a large amount of sea water and with a sunny climate. If the salt water is sea water the brine can easily be dropped back into the sea.

Another embodiment of the method according to the invention is characterised in that the treated water is potable.

If the desalination is done to a sufficient level, the water can be used for human and/or animal consumption and irrigation. Such level of desalination will be obtained by evaporation of part of the fluid.

The invention also relates to a device for dividing a fluid into at least a first and second fluid parts in an efficient and energy-saving manner.

This object is accomplished with the device according to the invention in that, the fluid treatment device comprises a heating element to heat the fluid and to divide the fluid into the first and second fluid part wherein the heat exchanger comprises at least three separated flow channels, a first flow channel for a flow of the fluid to be treated and a second and third flow channel for a flow of the first fluid part and a flow of the second fluid part and wherein the three separated flow channels are connected to the fluid treatment device, whereby before entering the fluid treatment device the flow of relatively cold fluid in the first flow channel is being preheated by the relatively warm photovoltaic solar panel, the relatively warm flow of the first fluid part in the second flow channel and the relatively warm flow of the second fluid part in the third flow channel.

In case that the photovoltaic solar panel, first fluid part and the second fluid part have a higher temperature than the fluid to be treated, heat will be transferred in the heat exchanger from the photovoltaic solar panel, first fluid part and the second fluid part to the fluid to be treated so that the fluid will be preheated before entering the fluid treatment device. Due to the heat transfer the device can be operated with a relatively small amount of external energy, preferably the electric energy of the photovoltaic solar panel.

An embodiment of the device according to the invention is characterised in that the photovoltaic solar panel is electrically connected to the fluid treatment device.

In this manner the electrical energy generated by the photovoltaic solar panel can be used for operating the fluid treatment device so that less external energy or even none external energy is needed for separating the fluid into two fluid parts.

Another embodiment of the device according to the invention is characterised in that the fluid treatment device comprises a boiling vessel.

Such a boiling vessel can easily be electrically operated to heat the fluid to any desired temperature, for example the boiling temperature of the fluid.

Another embodiment of the device according to the invention is characterised in that a first side of the photovoltaic solar panel and the heat exchanger is located at a lower level than a second side thereof, whereby the fluid treatment device is located near the second side at about the same level thereof.

In such an arrangement the first fluid part and second fluid part will flow from the fluid treatment device downwardly to the lower level of the second side under the force of gravity. The fluid to be treated will enter the heat exchanger preferably at the lower level and will, as soon as the device is operating, flow upwardly by means of a pump or by locating a reservoir of the fluid to be treated at a higher level than the second side.

Another embodiment of the device according to the invention is characterised in that the heat exchanger comprises a pane extending parallel to the photovoltaic solar panel at a distance thereof, which heat exchanger comprises a circumferential wall connected with a first side to edges of the photovoltaic solar panel and with a second side to edges of the pane, wherein a space bounded by the photovoltaic solar panel, the pane and the circumferential wall forms the first flow channel, whilst two tubes located in the space form the second and third flow channels.

Such heat exchanger is relatively easy to manufacture. The fluid to be treated will flow over the photovoltaic solar panel so that heat from the photovoltaic solar panel can easily be transferred to the fluid. Furthermore since the tubes for transporting the first and second fluid parts are located in the space filled with the fluid, also heat transfer from the first and second fluid parts through the walls of the tubes to the fluid will easily take place.

Another embodiment of the device according to the invention is characterised in that the heat exchanger is located on top of the photovoltaic solar panel, wherein the pane is at least transparent for solar energy.

The solar energy can easily reach the photovoltaic solar panel through the pane and the space between the pane and the photovoltaic solar panel. Furthermore, a person checking the device can easily look through the pane inside the heat exchanger and check if the fluid is still flowing. Preferably the pane is made of glass or plastic and forms an insulating layer for the heat of the fluid and fluid parts.

The invention will now be explained in more detail with reference to the drawing, in which:

FIG. 1 is a perspective view of the device according to the invention.

FIG. 1 shows a device 1 according to the invention. The device 1 comprises a table-like support structure 2 provided with a table top 3, two relative short front legs 4 and two relatively longer rear legs 5. Due to the difference in length of the front legs 4 and the rear legs 5, the table top 3 is tilted forwardly and encloses an angle A with the horizontal of about 30 degrees, for example.

The device 1 comprises an insulation layer 6 located on the table top 3, a photovoltaic solar panel 7 located on the insulation layer 6 and a heat exchanger 8 located on and against the solar panel 7. Near the top rear side the device 1 is provided with a fluid treatment device 9.

The photovoltaic solar panel 7 may compose a number of interconnected PV-cells and may have a length of 1.5 metre and a width of 1 metre.

The photovoltaic solar panel 7 is electrically connected to the fluid treatment device 9 by means of a plug 10 and socket 11.

The heat exchanger 8 comprises a circumferential wall 12 connected with a first side to edges 13 of the photovoltaic solar panel 7. The heat exchanger 8 also comprises a pane 14 extending parallel to the photovoltaic solar panel 12 at a distance thereof. The pane 14 is preferably made of glass or plastic being transparent for sun light. The circumferential wall 12 is connected with a second side to edges 15 of the pane 14. The photovoltaic solar panel 7, the pane 14 and the circumferential wall 12 bound a space 16. Inside the space 16 two tubes 17, 18 are located. The tubes 17, 18 meander from an upper part 19 of the circumferential wall 12 to a lower part 20 of the circumferential wall 12. At the upper part 19 the tubes 17, 18 are provided with fluid inlets 21, 22, whilst near the lower part 20 the tubes 17, 18 are provided with fluid outlets 23, 24. The device 1 comprises means for collecting fluid from the fluid outlets 23, 24, shown as buckets 25, 26 respectively.

Since the fluid inlet 27 to the space 16 is located at a lower level than the fluid outlet 29 of the space 16, the sea water entering the space 16 will automatically be located against the photovoltaic solar panel 7, the pane 14 and the circumferential wall 12. In this manner a good transfer of the heat of the solar panel 7 and the pane 14 to the sea water will be obtained. Furthermore, since the sea water will fill the space 16 from below, there will be no air between the sea water and the photovoltaic solar panel 7 and the pane 14.

The lower part 20 is furthermore provided with a fluid inlet 27 to the space 16, which fluid inlet 27 is connected on the other side to a sea water supply, shown as a bucket 28. The upper part 19 is provided with a fluid outlet 29 of the space 16.

The fluid treatment device 9 comprises a cylindrical vessel 30 with a spiral-shaped heating element 31. The heating element 31 is electrically connected to the socket 11. The fluid outlet 29 of the space 16 as well as the fluid inlets 21, 22 of the tubes 17, 18 are connected to the vessel 30.

The device 1 is suitable for desalination of salt water to obtain a potable water part and a brine in a self sustainable manner. To obtain the potable water, the device 1 is placed outdoors in the sun and close to a source of saline water, like the sea.

Radiation of the sun passes the pane 14 and the space 16 and reaches the photovoltaic solar panel 7, where the solar energy is converted into electrical energy. The radiation will also heat up the pane 14, the space 16 and the photovoltaic solar panel 7. Relative cold salt water is allowed to enter via the fluid inlet 27 the space 16 and will flow upwards towards the fluid outlet 29 of the space 16 and will continue to flow into the vessel 30. Since the bucket 28, representing a reservoir of salt water, is located at a higher level than the vessel 30, the salt water will automatically flow upwardly. If the device 1 is used, for example in the United Arab Emirates, the sea water may have a temperature in the summer of more than 30 degrees Celsius when entering the fluid inlet 27. Inside the vessel 30, the heating element 31 is powered by the electrical energy obtained from the photovoltaic solar panel 7. The salt water will be heated by the heating element 31 to the boiling temperature of the salt water. At the boiling temperature, part of the salt water will evaporate and become a vapor. The vapor is guided into the fluid inlet 21 and will flow under the force of gravity downwards through the tube 17 to the fluid outlet 23 and into the bucket 25. The vapor will condense between the vessel 30 and the bucket 25 to liquid water. This water is potable. To avoid that the vessel 30 will be filled with salt, brine being water containing a larger amount of salt and remaining at the bottom of the vessel 30, will be guided into the fluid inlet 22 and will flow under the force of gravity downwards through the tube 18 to the fluid outlet 24 and into the bucket 26.

As the cold water is flowing from the fluid inlet 27 to the fluid outlet 29, water will cool down the photovoltaic solar panel 7 due to which a better performance of the photovoltaic solar panel 7 will be obtained. By cooling down the photovoltaic solar panel 7, the temperature of the relative cold water will rise. The fluid parts flowing through the tubes 17, 18 have a higher temperature than the salt water flowing into the space 16, so that heat will also be transferred from the fluid parts in the tubes 17, 18 through the walls of the tubes 17, 18 to the salt water due to which the temperature of the salt water will further raise. By entering the vessel 30 the temperature of the salt water will be about 75 to 85 and preferably 90 to 95 degrees Celsius. In this manner the amount of energy to raise the temperature to the boiling temperature is relatively low since a large amount of the heating energy is obtained from cooling down the photovoltaic solar panel 7 and the fluid parts in the tubes 17, 18.

If the photovoltaic solar panel 7 delivers more electrical energy than needed for the heating element 31, the surplus of electrical energy can be stored in an accumulator like an battery. If the photovoltaic solar panel 7 delivers not enough electrical energy, additional electrical energy can be obtained from said accumulator or from an external energy source.

The device 1 is also suitable for dividing other kinds of fluids into at least two fluid parts, like ethanol-methanol-mixtures.

It is also possible that only one fluid part flows through the heat exchanger. However, in such a case the heat energy in the other fluid part will not be used to heat up the flow of fluid to be treated and will be lost.

It is also possible that the fluid treatment device 9 is another kind of device for separating the fluid into different fluid parts, for example a high-temperature reverse osmosis device or a multi-stage flash evaporation distillation device.

It will be clear that instead of buckets, reservoirs, containers and piping can be used to transport the fluid and fluid parts.

The upward flow of the incoming relatively cold salt water can also be realized by means of a pump being operated preferably by the energy generated by the photovoltaic solar panel 7.

It is also possible to mount the heat exchanger between the photovoltaic solar panel 7 and the insulation layer 6. One-way valves may be mounted in the heat exchanger to direct the flow of the fluid and/or fluid parts.

REFERENCE LIST 1 device
2 support structure
3 table top
4 front leg
5 rear leg
6 insulation layer
7 photovoltaic solar panel
8 heat exchanger
9 fluid treatment device
10 plug
11 socket
12 circumferential wall
13 edge
14 pane
15 edge
16 space
17 tube
18 tube
19 upper part
20 lower part
21 fluid inlet
22 fluid inlet
23 fluid outlet
24 fluid outlet
25 bucket
26 bucket
27 fluid inlet
28 bucket
29 fluid outlet
30 cylindrical vessel
31 spiral-shaped heating element

The invention claimed is:
1. A method for treating a fluid being salt water, whereby the salt water is divided into at least a first and second fluid part, wherein the first fluid part is desalinated water and the second fluid part is brine, wherein the brine has a larger amount of salt than the salt water, the method comprises the steps of:

flowing a flow of salt water to be treated from a reservoir into and along at least one photovoltaic solar panel being heated by solar energy towards and into a fluid treatment device, the salt water to be treated being cold relative to the photovoltaic solar panel;

heating the flow of salt water to be treated as it enters in the fluid treatment device via a heating element to evaporate part of the salt water into a vapour of evaporated desalinated water in the fluid treatment device, while brine remains in a bottom of the fluid treatment device;

flowing a next flow of salt water to be treated from the reservoir along at the least one photovoltaic solar panel being heated by solar energy towards and into the fluid treatment device;

flowing and condensing the vapour of evaporated desalinated water to form evaporated desalinated water in a first channel and flowing the brine in a second channel from the fluid treatment device along the at least one photovoltaic solar panel and along the next flow of salt water to be treated, wherein a direction of flowing of the evaporated desalinated water in the first channel and the brine in the second channel is opposite to a direction of the next flow of salt water to be treated;

wherein before entering the fluid treatment device the next flow of salt water to be treated from the reservoir is being preheated by each of the photovoltaic solar panel, the flow of the evaporated desalinated water in the first channel and the brine in the second channel.

2. A method according to claim 1, wherein heating element heats the flow of fluid salt water as it enters the fluid treatment device, the method further comprising converting the solar energy into electrical energy by the photovoltaic solar panel, which electrical energy is at least partly used to operate at least partly the heating element of the fluid treatment device.

3. A method according to claim 1, wherein the evaporated desalinated water is potable.

4. A device for treating a fluid being salt water, whereby the salt water is divided into a first and second fluid part, wherein the first part is desalinated water and the second fluid part is brine, wherein the brine has a larger amount of salt than the salt water, the device comprising:

a photovoltaic solar panel, a heat exchanger located against the photovoltaic solar panel, and a fluid treatment device containing a heating element to heat a flow of the salt water to be treated and to evaporate a part of the flow of salt water to be treated into a vapour of evaporated desalinated water whilst brine remains at a bottom of the fluid treatment device, wherein the heat exchanger comprises three separated flow channels, a first flow channel for a flow of the salt water to be treated, and a second flow channel for a flow and condensation of the vapour of evaporated desalinated water forming evaporated desalinated water, and a third flow channel for a flow of the brine, wherein the device is configured to provide a direction of the flows of the evaporated desalinated water and the brine opposite to a direction of the flow of the salt water to be treated, and wherein the three separated flow channels are connected to the fluid treatment device, wherein the device is configured to operate such that before entering the fluid treatment device a next flow of salt water to be treated is preheated in the first flow channel by each of the photovoltaic solar panel, the flow of the evaporated desalinated water in the second flow channel, and the flow of the brine in the third flow channel.

5. A device according to claim 4, wherein the photovoltaic solar panel is electrically connected to the fluid treatment device.

6. A device according to claim 4, wherein the fluid treatment device comprises a boiling vessel with the heating element.

7. A device according to claim 4, wherein the first flow channel of the heat exchanger is bounded by the photovoltaic solar panel, a pane extending parallel to the photovoltaic solar panel, which heat exchanger comprises a circumferential wall connected with a first side to edges of the photovoltaic solar panel and with a second side to edges of the pane, wherein two tubes located in the first flow channel form the second and third flow channels.

8. A device according to claim 7, wherein the first, second and third flow channels of the heat exchanger are located on top of the photovoltaic solar panel, and wherein the photovoltaic solar panel is at least transparent for solar energy.

* * * * *